United States Patent
Ueda et al.

(10) Patent No.: US 9,382,477 B2
(45) Date of Patent: Jul. 5, 2016

(54) OXYNITRIDE PHOSPHOR POWDER

(71) Applicant: Ube Industries, Ltd., Ube-shi (JP)

(72) Inventors: Takayuki Ueda, Ube (JP); Masataka Fujinaga, Ube (JP); Takuma Sakai, Ube (JP); Shinsuke Jida, Ube (JP)

(73) Assignee: Ube Industries, Ltd. (JP)

( * ) Notice: Subject to any disclaimer, the term of this patent is extended or adjusted under 35 U.S.C. 154(b) by 23 days.

(21) Appl. No.: 14/387,886

(22) PCT Filed: Mar. 28, 2013

(86) PCT No.: PCT/JP2013/059346
§ 371 (c)(1),
(2) Date: Sep. 25, 2014

(87) PCT Pub. No.: WO2013/147066
PCT Pub. Date: Oct. 3, 2013

(65) Prior Publication Data
US 2015/0044471 A1    Feb. 12, 2015

(30) Foreign Application Priority Data

Mar. 29, 2012 (JP) .............................. 2012-075608
Mar. 29, 2012 (JP) .............................. 2012-075623

(51) Int. Cl.
C09K 11/77 (2006.01)
H01L 33/50 (2010.01)

(52) U.S. Cl.
CPC .......... *C09K 11/7734* (2013.01); *H01L 33/502* (2013.01); *Y10T 428/2982* (2015.01)

(58) Field of Classification Search
CPC .............. C09K 11/7734; H01L 33/502; Y10T 428/2982
USPC .................... 428/402; 252/301.4 F
See application file for complete search history.

(56) References Cited

U.S. PATENT DOCUMENTS

| | | | |
|---|---|---|---|
| 8,613,869 B2 * | 12/2013 | Sakata et al. ............. | 252/301.4 F |
| 8,974,698 B2 * | 3/2015 | Fujinaga et al. ......... | 252/301.4 F |
| 9,023,240 B2 * | 5/2015 | Fujinaga et al. ......... | 252/301.4 F |
| 9,023,241 B2 * | 5/2015 | Fujinaga et al. ......... | 252/301.4 F |
| 9,085,462 B2 * | 7/2015 | Shibata et al. | |
| 2003/0030038 A1 | 2/2003 | Mitomo et al. | |
| 2003/0168643 A1 | 9/2003 | Mitomo et al. | |
| 2008/0309220 A1 * | 12/2008 | Sakata et al. ................. | 313/503 |
| 2009/0085465 A1 * | 4/2009 | Hirosaki et al. ............. | 313/503 |
| 2010/0208481 A1 | 8/2010 | Miyake et al. | |
| 2013/0020533 A1 | 1/2013 | Fujinaga et al. | |

FOREIGN PATENT DOCUMENTS

| | | |
|---|---|---|
| EP | 1 854 864 | 11/2007 |
| EP | 1854864 | * 11/2007 |
| JP | 2002-363554 A | 12/2002 |
| JP | 2005-008793 A | 1/2005 |
| JP | 2005-008794 A | 1/2005 |
| JP | 2005-286312 A | 10/2005 |
| JP | 2008-120949 A | 5/2008 |
| JP | 2009-096882 A | 5/2009 |
| JP | 2009-096883 A | 5/2009 |
| JP | 2012-036408 A | 2/2012 |
| WO | 2005/090514 A1 | 9/2005 |
| WO | 2006/070899 A1 | 7/2006 |
| WO | 2011/126035 | 10/2011 |
| WO | WO2011/126035 | * 10/2011 |

OTHER PUBLICATIONS

Supplementary European Search Report dated Nov. 9, 2015 of corresponding European Application No. 13768613.5.

W. Deliu, et al., "Study on Production of Rare Earth Element-Doped α-SiAlON Light Conversion Material for White Light-Emitting Diode and Light-Emitting Performance Thereof," Dec. 2011, pp. 7-63 with English abstract.

* cited by examiner

Primary Examiner — Leszek Kiliman
(74) *Attorney, Agent, or Firm* — DLA Piper LLP (US)

(57) ABSTRACT

An oxynitride phosphor power has a fluorescence peak wavelength of 580 to 605 nm, the oxynitride phosphor having a higher external quantum efficiency than ever before. The oxynitride phosphor powder is an oxynitride phosphor powder containing α-SiAlON and aluminum nitride, represented by composition formula:

$$Ca_{x1}Eu_{x2}Si_{12-(y+z)}Al_{(y+z)}O_zN_{16-z}$$

wherein x1, x2, y and z are $0 < x1 \leq 2.50$, $0.01 \leq x2 \leq 0.20$, $0 < y \leq 2.3$ and $1.5 \leq z \leq 3.5$, or x1, x2, y and z are $0 < x1 \leq 2.70$, $0.05 \leq x2 \leq 0.20$, $2.3 \leq y \leq 5.5$ and $1 \leq z \leq 2.5$.

24 Claims, 5 Drawing Sheets

OXYNITRIDE PHOSPHOR POWDER

TECHNICAL FIELD

The present invention relates to an oxynitride phosphor powder composed of a rare earth metal element-activated α-SiAlON and aluminum nitride, which is suitable for an ultraviolet-blue light source. More specifically, the present invention relates to an oxynitride phosphor powder having a fluorescence peak wavelength in the range of 580 to 605 nm and exhibiting practical external quantum efficiency and fluorescence intensity.

BACKGROUND ART

Recently, with practical implementation of a blue light-emitting diode (LED), development of a white LED using this blue LED is being aggressively pursued. A white LED ensures low power consumption and extended life compared with existing white light sources, and therefore its application to liquid crystal panel backlight, indoor or outdoor lighting devices, and the like is expanding.

The white LED developed at present is obtained by coating a Ce-doped YAG (yttrium.aluminum.garnet) on the surface of a blue LED. However, the fluorescence peak wavelength of the Ce-doped YAG is in the vicinity of 530 nm and when this fluorescence color and the light of blue LED are mixed to produce white light, the light is slightly blue-tinted. This kind of white LED has the problem of a poor color rendering property.

To cope with this problem, many oxynitride phosphors are being studied and among others, an Eu-activated α-SiAlON phosphor is known to emit fluorescence (yellow-orange) with a peak wavelength of around 580 nm that is longer than the fluorescence peak wavelength of the Ce-doped YAG (see, Patent Document 1). When a white LED is fabricated by using the α-SiAlON phosphor above or by combining it with a Ce-doped YAG phosphor, a white LED giving a light bulb color at a lower color temperature than a white LED using only Ce-doped YAG can be produced.

However, as a Ca-containing α-SiAlON phosphor activated with Eu, represented by the formula:

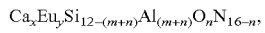

$Ca_xEu_ySi_{12-(m+n)}Al_{(m+n)}O_nN_{16-n}$, a phosphor having a high enough luminance for practical use has not been developed yet.

Patent Document 2 discloses a phosphor exhibiting an excellent luminous efficiency and having a fluorescence peak at a wavelength of 595 nm or more, and a production method thereof, where smooth-surface particles larger than ever before are obtained by adding a previously synthesized α-SiAlON powder as a seed crystal for grain growth to the raw material powders and a powder having a specific particle size is obtained from the synthesized powder without applying a pulverization treatment.

Specifically, an α-SiAlON phosphor which is an α-SiAlON phosphor (x+y=1.75, O/N=0.03) having a composition of $(Ca_{1.67}, Eu_{0.08})(Si,Al)_{12}(O,N)_{16}$ and in which the peak wavelength of the fluorescence spectrum obtained by excitation with a blue light of 455 nm is from 599 to 601 nm and the luminous efficiency (=external quantum efficiency=absorptivity×internal quantum efficiency) is from 61 to 63%, is disclosed.

However, in the document above, specific examples of a phosphor with a florescence peak wavelength of less than 599 nm and a phosphor with that of more than 601 nm, each having a luminous efficiency enough for practical use, are not illustrated.

Patent Document 3 discloses: a light-emitting device characterized by using a phosphor containing, as a main component, an α-SiAlON represented by the formula: $(Ca_\alpha, Eu_\beta)(Si,Al)_{12}(O,N)_{16}$ (provided that $1.5<\alpha+\beta<2.2$, $0<\beta<0.2$ and $O/N\leq0.04$) and having a specific surface area of 0.1 to 0.35 $m^2/g$; a vehicle lighting device using the same; and a headlamp.

The document above discloses working examples of an α-SiAlON phosphor, where the peak wavelengths of the fluorescence spectra obtained by excitation with a blue light of 455 nm are 592 nm, 598 nm and 600 nm, and the luminous efficiencies (=external quantum efficiency) thereof are reported as 61.0%, 62.7%, and 63.2%, respectively.

However, in the document above, specific examples of a phosphor with a fluorescence peak wavelength of less than 592 nm and a phosphor with more than 600 nm, each having a luminous efficiency enough for practical use, are not illustrated.

Patent Document 4 discloses a SiAlON phosphor having a specific property of emitting light with a higher luminance compared to conventional phosphors, where a metal compound mixture capable of composing a SiAlON phosphor through firing is fired in a specific temperature range in a gas under a specific pressure, pulverized to a specific particle diameter, and then subjected to classification and a heat treatment.

However, the matter specifically disclosed in the document above is only the peak luminous intensity and since the peak luminous intensity varies depending on the measuring apparatus and measurement conditions, it is not known whether a luminous intensity high enough for practice use is obtained.

RELATED ART

Patent Document

Patent Document 1: Kokai (Japanese Unexamined Patent Publication) No. 2002-363554
Patent Document 2: Kokai No. 2009-96882
Patent Document 3: Kokai No. 2009-96883
Patent Document 4: Kokai No. 2005-008794

SUMMARY OF THE INVENTION

Problems to be Solved by the Invention

A phosphor having a high luminance enough for practical use is demanded for the purpose of adjusting the color temperature of a white LED or obtaining yellow-orange luminescence of a desired wavelength, nevertheless, as described above, an α-SiAlON phosphor exhibiting a high efficiency enough for practical use and having a fluorescence peak wavelength of a broad emission peak wavelength of 580 to 605 nm is not known.

An object of the present invention is to provide an oxynitride phosphor having a fluorescence peak wavelength of 580 to 605 nm and having external quantum efficiency higher than ever before.

Means to Solve the Problems

As a result of intensive studies to attain the object above, the present inventors have found that when a silicon source substance, an aluminum source substance, a calcium source substance, and a europium source substance, are mixed and fired so as to give a composition represented by the composition formula:

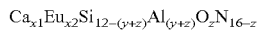
$Ca_{x1}Eu_{x2}Si_{12-(y+z)}Al_{(y+z)}O_zN_{16-z}$ (wherein $0<x1\leq 2.50$, $0.01\leq x2\leq 0.20$, $0<y\leq 2.3$ and $1.5\leq z\leq 3.5$ or wherein $0<x1\leq 2.70$, $0.05\leq x2\leq 0.20$, $2.3\leq y\leq 5.5$ and $1\leq z\leq 2.5$), and an oxynitride phosphor powder containing α-SiAlON and aluminum nitride is obtained thereby, the oxynitride phosphor powder emits fluorescence having a peak wavelength in a broad wavelength region of 580 to 605 nm by excitation with light having a wavelength of 450 nm and exhibits a particularly high external quantum efficiency in the light emission. The present invention has been accomplished based on this finding.

That is, the present invention resides in the following.

(1) An oxynitride phosphor powder containing α-SiAlON and aluminum nitride, represented by the composition formula:

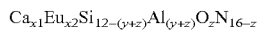
$Ca_{x1}Eu_{x2}Si_{12-(y+z)}Al_{(y+z)}O_zN_{16-z}$ (wherein x1, x2, y and z are $0<x1\leq 2.50$, $0.01\leq x2\leq 0.20$, $0<y\leq 2.3$ and $1.5\leq z\leq 3.5$, or $0<x1\leq 2.70$, $0.05\leq x2\leq 0.20$, $2.3\leq y\leq 5.5$ and $1\leq z\leq 2.5$).

(2) The oxynitride phosphor powder according to (1) above, wherein in the composition formula, x1, x2, y and z are $0<x1\leq 2.50$, $0.01\leq x2\leq 0.20$, $0.5<y\leq 2.0$ and $2.5\leq z\leq 3.2$.

(3) The oxynitride phosphor powder according to (1) above, wherein the content of aluminum nitride is from more than 0 wt % to less than 15 wt %.

(4) The oxynitride phosphor powder according to (1) to (3) above, wherein the lattice constants of the α-SiAlON crystal phase contained in the oxynitride phosphor powder are 7.84 Å≤a=b≤7.89 Å and 5.70 Å≤c≤5.74 Å.

(5) The oxynitride phosphor powder according to (1) to (4) above, wherein fluorescence having a peak wavelength in a wavelength region of 580 to 600 nm is emitted by excitation with light having a wavelength of 450 nm and the external quantum efficiency in the light emission is 60% or more.

(6) The oxynitride phosphor powder according to (1) above, wherein in the composition formula, $2.3<y\leq 2.5$ and the content of aluminum nitride is from more than 0 wt % to less than 15 wt %.

(7) The oxynitride phosphor powder according to (1) above, wherein in the composition formula, $2.5<y\leq 5.5$ and the content of aluminum nitride is from more than 0 wt % to less than 32 wt %.

(8) The oxynitride phosphor powder according to (1), (6) and (7) above, wherein the lattice constants of the α-SiAlON crystal phase constituting the oxynitride phosphor powder are, in the composition formula, $2.3<y\leq 4.0$, 7.90 Å≤a=b≤7.96 Å and 5.75 Å≤c≤5.79 Å.

(9) The oxynitride phosphor powder according to (1), (6) and (7) above, wherein the lattice constants of the α-SiAlON crystal phase constituting the oxynitride phosphor powder are, in the composition formula, $4.0<y\leq 5.5$, 7.95 Å≤a=b≤7.99 Å and 5.77 Å≤c≤5.80 Å.

(10) The oxynitride phosphor powder according to (1) and (6) to (9) above, wherein fluorescence having a peak wavelength in a wavelength region of 590 to 605 nm is emitted by excitation with light having a wavelength of 450 nm and the external quantum efficiency in the light emission is 60% or more.

(11) The oxynitride phosphor powder according to (1) to (10) above, wherein the 50% diameter ($D_{50}$) in the particle size distribution curve measured by a laser diffraction/scattering particle size distribution measuring apparatus is from 10.0 to 20.0 μm and the specific surface area is from 0.2 to 0.6 $m^2/g$.

(12) A method for producing an oxynitride phosphor powder, comprising mixing a silicon source substance, an aluminum source substance, a calcium source substance, and a europium source substance to give a composition represented by the composition formula:

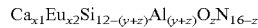
$Ca_{x1}Eu_{x2}Si_{12-(y+z)}Al_{(y+z)}O_zN_{16-z}$ (wherein x1, x2, y and z are $0<x1\leq 2.50$, $0.01\leq x2\leq 0.20$, $0<y\leq 2.3$ and $1.5\leq z\leq 3.5$, or x1, x2, y and z are $0<x1\leq 2.70$, $0.05\leq x2\leq 0.20$, $2.3\leq y\leq 5.5$ and $1\leq z\leq 2.5$), and firing the mixture to produce an oxynitride phosphor powder containing α-SiAlON and aluminum nitride.

(13) The method for producing an oxynitride phosphor powder according to (12) above, wherein the firing is performed at a temperature of 1,500 to 2,000° C. in an inert gas atmosphere.

(14) The method for producing an oxynitride phosphor powder according to (13) or (14) above, wherein a fired product obtained by the firing is further heat-treated at a temperature of 1,100 to 1,600° C. in an inert gas atmosphere.

Effects of the Invention

According to the present invention, an oxynitride phosphor powder containing α-SiAlON and aluminum nitride, wherein in an oxynitride phosphor represented by the composition formula:

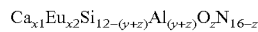
$Ca_{x1}Eu_{x2}Si_{12-(y+z)}Al_{(y+z)}O_zN_{16-z}$ $0<x1\leq 2.50$, $0.01\leq x2\leq 0.20$, $0<y\leq 2.3$ and $1.5\leq z\leq 3.5$, or $0<x1\leq 2.70$, $0.05\leq x2\leq 0.20$, $2.3\leq y\leq 5.5$ and $1\leq z\leq 2.5$, is provided. This oxynitride phosphor powder is a highly efficient oxynitride phosphor powder that emits fluorescence having a peak wavelength in a broad wavelength region of 580 to 605 nm by excitation with light having a wavelength of 450 nm and exhibits in particular high external quantum efficiency in the light emission.

MODE FOR CARRYING OUT THE INVENTION

The present invention is described in detail below.

The present invention relates to an oxynitride phosphor powder containing α-SiAlON and aluminum nitride, wherein in an oxynitride phosphor represented by the composition formula:

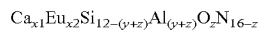
$Ca_{x1}Eu_{x2}Si_{12-(y+z)}Al_{(y+z)}O_zN_{16-z}$ $0<x1≤2.50$, $0.01≤x2≤0.20$, $0<y≤2.3$ and $1.5≤z≤3.5$, or $0<x1≤2.70$, $0.05≤x2≤0.20$, $2.3≤y≤5.5$ and $1≤z≤2.5$, which is an oxynitride phosphor powder that emits fluorescence having a peak wavelength in a broad wavelength region of 580 to 605 nm by excitation with light having a wavelength of 450 nm and exhibits in particular high external quantum efficiency in the light emission.

The α-SiAlON, particularly, the Ca-containing α-SiAlON, is a solid solution where a part of Si—N bonds of α-silicon nitride are replaced by Al—N bonds and Al—O bonds and Ca ions are dissolved interstitially in the lattice and are solid-dissolved, thereby maintaining the electrical neutrality.

In the α-SiAlON phosphor contained in the oxynitride phosphor of the present invention, Eu ions are dissolved interstitially in the lattice and is solid-dissolved, in addition to the Ca ions, and the Ca-containing α-SiAlON is thereby activated to give a phosphor represented by the formula above, which emits yellow-orange fluorescence by excitation with blue light.

The α-SiAlON phosphor obtained by activating a general rare earth element is, as described in Patent Document 1, represented by $MeSi_{12-(m+n)}Al_{(m+n)}O_nN_{16-n}$ (wherein Me is Ca, Mg, Y, or one lanthanide metal or two or more lanthanide metals excluding La and Ce), and the metal Me is solid-dissolved in the range of, at the minimum, one per three large unit cells of α-SiAlON containing four formula weights of $(Si,Al)_3(N,O)_4$ to, at the maximum, one per one unit cell thereof. The solid solubility limit is, in general, in case of divalent metal Me, $0.6<m<3.0$ and $0≤n<1.5$ in the formula above and, in case of trivalent metal Me, $0.9<m<4.5$ and $0≤n<1.5$. Outside these ranges, a single-phase α-SiAlON is not obtained. Accordingly, studies of the α-SiAlON phosphor had been so far limited to the above-described composition ranges.

The present inventors have made intensive studies also on the region outside the composition range where a single-phase α-SiAlON is obtained in general, as a result, it has been found that in comparison with a phosphor in the above-described composition range where a single-phase α-SiAlON is obtained, the luminous efficiency is remarkably enhanced, as in the present invention, in a composition region where a single-phase α-SiAlON had not been conventionally obtained.

The oxynitride phosphor powder of the present invention is specifically described below.

Figure 1:
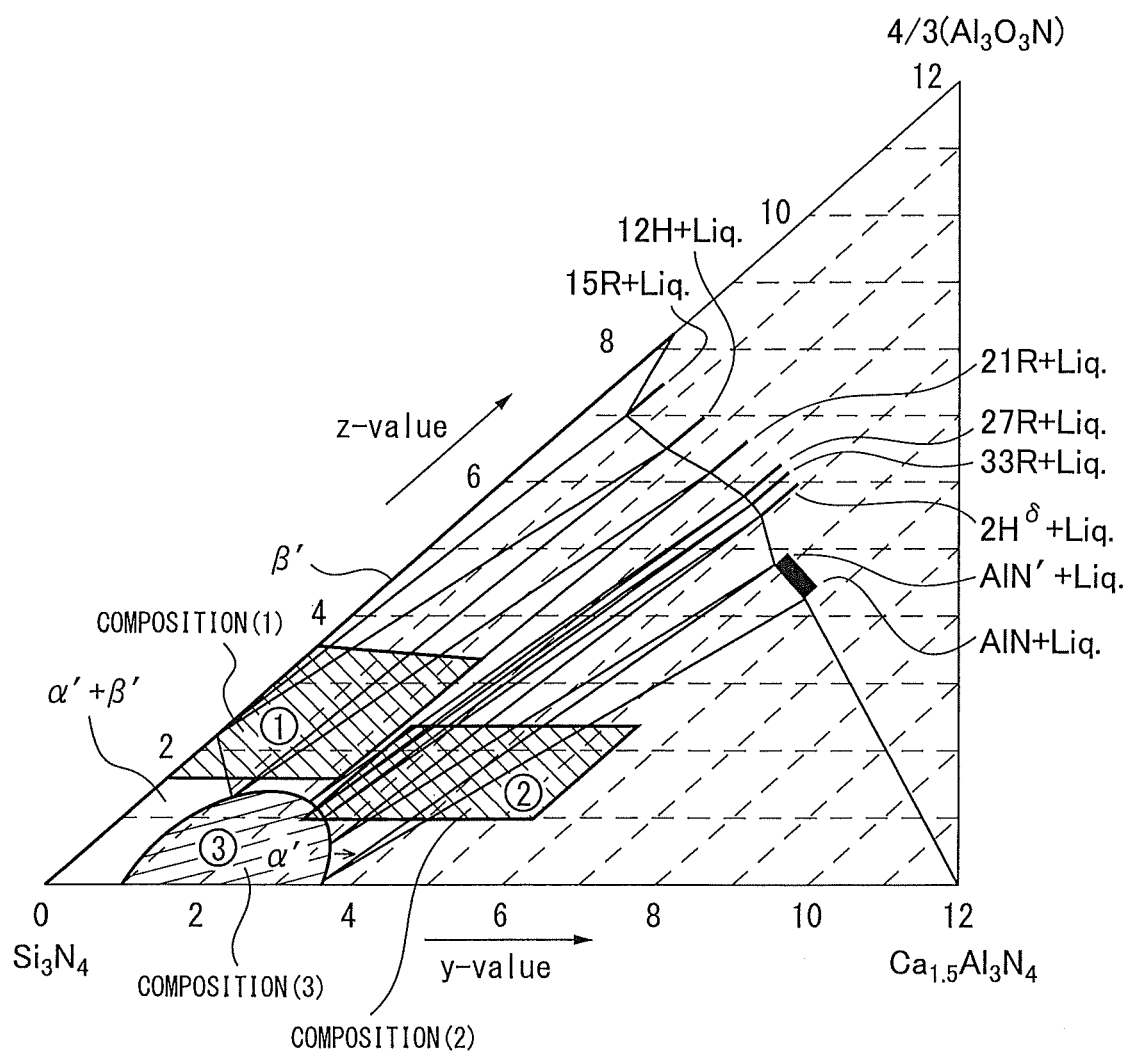
FIG. 1 shows the compositional range of the oxynitride phosphor powder of the present invention.

The oxynitride phosphor powder of the present invention is an oxynitride phosphor powder containing α-SiAlON and aluminum nitride, represented by the composition formula:

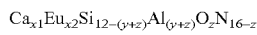

which is (1) a composition where $0<x1≤2.50$, $0.01≤x2≤0.20$, $0<y≤2.3$ and $1.5≤z≤3.5$, or (2) a composition where $0<x1≤2.70$, $0.05≤x2≤0.20$, $2.3≤y≤5.5$ and $1≤z≤2.5$. These regions of composition (1) and composition (2) are formally described as two regions, but it should be kept in mind that as shown in the composition diagram of FIG. 1, respective regions of composition (1) and composition (2) are adjacent to the composition range (3) of α-SiAlON and are connected to each other to make up substantially one composition region and merely for the sake of expression of the composition formula, these are clipped and described as two composition regions. In the following, formally, oxynitride phosphor powers in two composition regions of composition (1) and composition (2) are separately described, but these are practically an oxynitride phosphor powder in one continuing composition region.

The oxynitride phosphor powder of composition (1) of the present invention is an oxynitride phosphor powder containing α-SiAlON and aluminum nitride, represented by the composition formula:

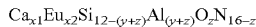

wherein $0<x1≤2.50$, $0.01≤x2≤0.20$, $0<y≤2.3$ and $1.5≤z≤3.5$.

x1 and x2 are values indicating the amounts of Ca ion and Eu ion dissolved interstitially in SiAlON, and if x2 is less than 0.01 or exceeds 0.20 or if x1 exceeds 2.50, the external quantum efficiency decreases below 60%. x1 and x2 are preferably $0.4<x1<1.0$ and $0.015≤x2≤0.060$, respectively.

y is a value determined so as to keep the electrical neutrality at the time of solid solution formation of a metal element in SiAlON and is represented by $y=2(x1)+3(x2)$ in the oxynitride phosphor powder above. In the formula, the coefficient of 2 of x1 is a numerical value assigned by the valence of Ca ion solid-dissolved in the Ca-containing α-SiAlON phosphor and the coefficient of 3 of x2 is a numerical value assigned by the valence of Eu ion solid-dissolved in the Ca-containing α-SiAlON phosphor. Also, the oxynitride phosphor of composition (1) of the present invention contains α-SiAlON and aluminum nitride and therefore, y is a value related to the amount of aluminum nitride produced. That is, when the y value exceeds the composition region where a single-phase α-SiAlON is obtained, aluminum nitride and other aluminum-containing oxynitrides are produced.

In composition (1) of the present invention, the ranges of y and z are $0<y≤2.3$ and $1.5≤z≤3.5$. In the case of a composition where y and z are in these ranges, a highly efficient oxynitride phosphor powder having an external quantum efficiency of 60% or more is provided.

If y exceeds 2.3, the emission peak wavelength exceeds 600 nm. Also, z is a value related to the amount of oxygen solid-dissolved by replacement in α-SiAlON. If z exceeds 3.5, the amount of aluminum oxynitride crystal phase ($Al_{2.81}O_{3.56}N_{0.44}$ crystal phase) produced becomes too large and the external quantum efficiency decreases below 60%. Furthermore, if $1≤y<2.3$ and $0≤z<1.5$ or if $2.3≤y<4.0$ and $0≤z<1$, the external quantum efficiency decreases to 60% or less. In addition, if $0≤y<1.0$ and $0≤z<1.5$, β-SiAlON is produced and the external quantum efficiency decreases to 60% or less.

Also, in composition (1) of the present invention, the ranges of y and z are preferably $0.5<y≤2.0$ and $2.5≤z≤3.2$, respectively. In the case of a composition where y and z are in these ranges, a highly efficient oxynitride phosphor powder having higher external quantum efficiency is provided.

When crystal phases are identified by an X-ray diffractometer (XRD) using CuKα radiation, the oxynitride phosphor powder of composition (1) of the present invention is composed of an α-SiAlON crystal phase classified into a trigonal system and an aluminum nitride crystal phase classified into a hexagonal system and sometimes contains an aluminum oxynitride crystal phase ($Al_{2.81}O_{3.56}N_{0.44}$), in addition to the above-mentioned crystal phases. In the case of a single phase of α-SiAlON crystal phase, the external quantum efficiency becomes low, and if the contents of an aluminum nitride crystal phase and an aluminum oxynitride crystal phase are too much increased, the external quantum efficiency decreases. The content of the aluminum nitride crystal phase contained in the oxynitride phosphor powder is preferably more than 0 wt % to less than 15 wt %. In the case of containing the aluminum nitride crystal phase in this range, the external quantum efficiency becomes high. In a preferred embodiment, the content of the aluminum nitride crystal phase contained in the oxynitride phosphor powder is from 5 to 13 wt %, more preferably from 8 to 12 wt %.

In the oxynitride phosphor powder of composition (1) of the present invention, the total content of α-SiAlON crystal phase and aluminum nitride crystal phase is preferably 85 wt % or more, more preferably 89 wt % or more. Also, the total content of all other crystal phases such as aluminum oxynitride crystal phase ($Al_{2.81}O_{3.56}N_{0.44}$), excluding α-SiAlON crystal phase and aluminum nitride crystal phase, is preferably 15 wt % or less, more preferably 11 wt % or less.

Furthermore, the oxynitride phosphor powder of composition (1) of the present invention contains an α-SiAlON crystal phase and an aluminum nitride crystal phase, and grains containing an α-SiAlON crystal phase as the main component and grains containing an aluminum nitride crystal phase as the main component exist individually. How the grains containing respective crystal phases as the main components exist can be confirmed, for example, by observing the cross-section of the oxynitride phosphor powder on a reflected electron image of a scanning electron microscope and performing composition analysis of each particle by energy dispersive X-ray analysis (EDS). In the case where grains containing respective crystal phases as the main components exist individually as in composition (1) of the present invention, the external quantum efficiency is likely to become high and this is preferred.

Also, the lattice constants of the α-SiAlON crystal phase and the aluminum nitride crystal phase can be determined by XRD measurement. In the oxynitride phosphor powder of composition (1) of the present invention, the lattice constant of the constituent α-SiAlON crystal phase is preferably 7.84 Å≤a=b≤7.89 Å and 5.70 Å≤c≤5.74 Å. If the lattice constant of the α-SiAlON crystal phase is outside of this range, the external quantum efficiency decreases.

Furthermore, in the oxynitride phosphor powder of composition (1) of the present invention, the lattice constant of the constituent α-SiAlON crystal phase is more preferably 7.86 Å≤a=b≤7.89 Å and 5.71 Å≤c≤5.74 Å. When the lattice constant is in this range, the external quantum efficiency becomes higher.

In the oxynitride phosphor powder of composition (1) of the present invention, the lattice constant of the constituent aluminum nitride crystal phase is preferably 3.07 Å≤a=b≤3.10 Å and 4.81 Å≤c≤4.86 Å. When the lattice constant of the aluminum nitride crystal phase is in this range, the external quantum efficiency becomes higher.

Identification of crystal phase in XRD analysis, refinement of lattice constant, and quantification of crystal phase can be performed using an X-ray pattern analysis software. The analysis software includes, for example, PDXL produced by Rigaku Corporation. Incidentally, the XRD analysis and refinement of lattice constant of the oxynitride phosphor powder and the quantification of crystal phase by the Rietveld method were performed using X-ray diffractometer ("Ultima IV Protectus") and analysis software ("PDXL") produced by Rigaku Corporation.

In order to suitably use the oxynitride phosphor powder of composition (1) of the present invention as a phosphor for white LED, it is preferred that $D_{50}$ (average particle diameter) as the 50% diameter in the particle size distribution curve is from 10.0 to 20.0 μm and the specific surface area is from 0.2 to 0.6 m²/g. Because, if $D_{50}$ is less than 10.0 μm or the specific surface area exceeds 0.6 m²/g, the luminous intensity may be reduced, and if $D_{50}$ exceeds 20.0 μm or the specific surface area is less than 0.2 m²/g, the powder may be hardly dispersed uniformly in the resin encapsulating the phosphor and variation sometimes occurs in the color tone of white LED. The average particle diameter ($D_{50}$) is more preferably from 15 to 17 μm, and the specific surface area is more preferably from 0.2 to 0.3 m²/g.

As for the method to control the particle diameter and specific surface area of the oxynitride phosphor powder of composition (1) of the present invention, their control can be achieved by controlling the particle diameter of the raw material silicon nitride powder. Use of a silicon nitride powder having an average particle diameter ($D_{50}$) of 1.5 μm or more is preferred, because $D_{50}$ of the oxynitride phosphor powder becomes 10 μm or more and at the same time, the specific surface area becomes from 0.2 to 0.6 m²/g, leading to a higher external quantum efficiency.

$D_{50}$ of the oxynitride phosphor powder is a 50% diameter in the particle size distribution curve measured by a laser diffraction/scattering particle size distribution measuring apparatus. Also, the specific surface area of the oxynitride phosphor powder was measured by a specific surface area measuring apparatus, FlowSorb Model 2300, manufactured by Shimadzu Corporation (BET method by nitrogen gas adsorption).

The oxynitride phosphor powder of composition (1) of the present invention can emit fluorescence having a peak wavelength in the wavelength region of 580 to 600 nm by excitation with light in a wavelength region of 450 nm and at this time, can exhibit an external quantum efficiency of 60% or more. As a result of these capabilities, in the oxynitride phosphor powder of composition (1) of the present invention, long-wavelength orange fluorescence can be efficiently obtained by blue excitation light, and furthermore, white light having a high color rendering property can be efficiently obtained by the combination with blue light used as excitation light.

The fluorescence peak wavelength can be measured using a solid quantum efficiency measuring apparatus fabricated by combining an integrating sphere with FP-6500 manufactured by JASCO. The fluorescence spectrum correction can be performed using a secondary standard light source, but the fluorescence peak wavelength sometimes slightly varies depending on the measuring device used or correction conditions.

Also, after measuring the absorptivity and internal quantum efficiency by a solid quantum efficiency measuring apparatus fabricated by combining an integrating sphere with FP-6500 manufactured by JASCO, the external quantum efficiency can be calculated from the product thereof.

The oxynitride phosphor powder of composition (2) of the present invention is an oxynitride phosphor powder containing α-SiAlON and aluminum nitride, represented by the composition formula:

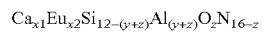

$$Ca_{x1}Eu_{x2}Si_{12-(y+z)}Al_{(y+z)}O_zN_{16-z}$$

wherein 0<x1≤2.70, 0.05≤x2≤0.20, 2.3≤y≤5.5 and 1≤z≤2.5.

x1 and x2 are values indicating the intruding solid solubility of Ca ions and Eu ions into SiAlON, and if x2 is less than 0.05 or exceeds 0.20 or if x1 exceeds 2.70, the external quantum efficiency decreases below 60%. x1 and x2 are preferably 1.7≤x1≤1.9 and 0.1≤x2≤0.2, respectively.

y is a value determined so as to keep the electrical neutrality at the time of solid solution formation of a metal element with SiAlON and is represented by y=2(x1)+3(x2) in the oxynitride phosphor powder above. In the formula, the coefficient of 2 of x1 is a numerical value assigned by the valence of Ca ion forming a solid solution with the Ca-containing α-SiAlON phosphor and the coefficient of 3 of x2 is a numerical value assigned by the valence of Eu ion forming a solid solution with the Ca-containing α-SiAlON phosphor. Also, the oxynitride phosphor of the present invention contains α-SiAlON and aluminum nitride and therefore, y is a value related to the amount of aluminum nitride produced. That is, when the y value exceeds the composition region where a single-phase α-SiAlON is obtained, aluminum nitride and other aluminum-containing oxynitrides are produced.

In composition (2) of the present invention, the ranges of y and z are 2.3≤y≤5.5 and 1≤z≤2.5. In the case of a composition where y and z are in these ranges, a highly efficient oxynitride phosphor powder having an external quantum efficiency of 60% or more is provided.

If y exceeds 5.5, the amount of an aluminum nitride crystal phase produced becomes too large, and the external quantum efficiency decreases below 60%. Also, if y is less than 2.3, the emission peak wavelength becomes smaller than 590 nm. Furthermore, z is a value related to the amount of oxygen solid-dissolved by replacement in α-SiAlON. If z exceeds 2.5, an aluminum oxynitride crystal phase is produced in a large amount and the external quantum efficiency decreases below 60%. In addition, if 1≤y<2.3 and 0≤z<1.5 or if 2.3≤y<4.0 and 0≤z<1, the external quantum efficiency decreases to less than 60%. Also, if 0≤y<1.0 and 0≤z<1.5, β-SiAlON is produced and the external quantum efficiency decreases to less than 60%.

When crystal phases are identified by an X-ray diffractometer (XRD) using CuKα radiation, the oxynitride phosphor powder of composition (2) of the present invention is composed of an α-SiAlON crystal phase classified into a trigonal system and an aluminum nitride crystal phase classified into a hexagonal system. In the case of a single phase of α-SiAlON crystal phase, the external quantum efficiency becomes low, and if the content of an aluminum nitride crystal phase is too much increased, the external quantum efficiency decreases. The content of the aluminum nitride crystal phase contained in the oxynitride phosphor powder is, when 2.3<y≤2.5 in the composition formula above, preferably from more than 0 wt % to less than 15 wt %, and when 2.5<y≤5.5, preferably from more than 0 wt % to less than 32 wt %. In the case of containing the aluminum nitride crystal phase in this range, the external quantum efficiency becomes high. The content of the aluminum nitride crystal phase contained in the oxynitride phosphor powder is, when 2.3<y≤2.5 in the composition formula above, preferably from 0.1 or more, 0.5 wt % or more, further 1 wt % or more, and 2 wt % or less, and when 2.5<y≤5.5, preferably from 3 to 27 wt %, more preferably from 3 to 11 wt %.

In the oxynitride phosphor powder of composition (2) of the present invention, the total content of α-SiAlON crystal phase and aluminum nitride crystal phase is preferably 90 wt % or more, more preferably 95 wt % or more, still more preferably 99 wt % or more. Also, the total content of all other crystal phases such as aluminum oxynitride crystal phase ($Al_{2.81}O_{3.56}N_{0.44}$), excluding α-SiAlON crystal phase and aluminum nitride crystal phase, is preferably 10 wt % or less, more preferably 5 wt % or less, still more preferably 1 wt % or less.

Furthermore, the oxynitride phosphor powder of composition (2) of the present invention contains an α-SiAlON crystal phase and an aluminum nitride crystal phase, and grains containing an α-SiAlON crystal phase as the main component and grains containing an aluminum nitride crystal phase as the main component exist individually. How the grains containing respective crystal phases as the main components exist can be confirmed, for example, by observing the cross-section of the oxynitride phosphor powder on a reflected electron image of a scanning electron microscope and performing composition analysis of each particle by energy dispersive X-ray analysis (EDS). In the case where grains containing respective crystal phases as the main components exist individually as in composition (2) of the present invention, the external quantum efficiency is likely to become high and this is preferred.

Also, the lattice constants of the α-SiAlON crystal phase and the aluminum nitride crystal phase can be determined by XRD analysis. In the oxynitride phosphor powder of composition (1) of the present invention, the lattice constant of the constituent α-SiAlON crystal phase is, when 2.3<y≤4.0 in the composition formula above, preferably 7.90 Å≤a=b≤7.96 Å and 5.75 Å≤c≤5.79 Å, and when 4.0<y≤5.5, preferably 7.95 Å≤a=b≤7.99 Å and 5.77 Å≤c≤5.80 Å. If the lattice constant of the α-SiAlON crystal phase is outside of these ranges, the external quantum efficiency decreases.

In the oxynitride phosphor powder of composition (2) of the present invention, the lattice constant of the constituent aluminum nitride crystal phase is preferably 3.10 Å≤a=b≤3.12 Å and 4.83 Å≤c≤4.91 Å. When the lattice constant of the aluminum nitride crystal phase is in this range, the external quantum efficiency becomes higher.

Furthermore, in composition (2) of the present invention, the ranges of y and z are preferably 4.0≤y≤5.5 and 1.0≤z≤2.5, respectively. In the case of a composition where y and z are in these ranges, a highly efficient oxynitride phosphor powder having higher external quantum efficiency is provided.

Identification of crystal phase by XRD analysis, refinement of lattice constant, and quantification of crystal phase can be performed using X-ray pattern analysis software. The analysis software includes, for example, PDXL produced by Rigaku Corporation. Incidentally, the XRD analysis and refinement of lattice constant of the oxynitride phosphor powder and the quantification of crystal phase by the Rietveld method were performed using X-ray diffractometer (Ultima IV Protectus) and analysis software (PDXL) produced by Rigaku Corporation.

In order to suitably use the oxynitride phosphor powder of composition (2) of the present invention as a phosphor for a white LED, it is preferred that $D_{50}$ as the 50% diameter in the particle size distribution curve is from 10.0 to 20.0 μm and the specific surface area is from 0.2 to 0.6 m$^2$/g. Because, if $D_{50}$ is less than 10.0 μm or the specific surface area exceeds 0.6 m$^2$/g, the luminous intensity may be reduced, and if $D_{50}$ exceeds 20.0 μm or the specific surface area is less than 0.2 m$^2$/g, the powder may be hardly dispersed uniformly in the resin encapsulating the phosphor and variation sometimes occurs in the color tone of a white LED. The average particle diameter ($D_{50}$) is more preferably from 13 to 15 μm, and the specific surface area is more preferably from 0.3 to 0.4 m$^2$/g.

As for the method to control the particle diameter and specific surface area of the oxynitride phosphor powder of composition (2) of the present invention, their control can be achieved by controlling the particle diameter of the raw material silicon nitride powder. Use of a silicon nitride powder having an average particle diameter ($D_{50}$) of 1.5 μm or more is preferred, because $D_{50}$ of the oxynitride phosphor powder becomes 10 μm or more and at the same time, the specific surface area becomes from 0.2 to 0.6 m$^2$/g, leading to a higher external quantum efficiency.

$D_{50}$ of the oxynitride phosphor powder is a 50% diameter in the particle size distribution curve measured by a laser diffraction/scattering particle size distribution measuring apparatus. Also, the specific surface area of the oxynitride phosphor powder was measured by a specific surface area measuring apparatus, FlowSorb Model 2300, manufactured by Shimadzu Corporation (BET method by nitrogen gas adsorption).

The oxynitride phosphor powder of composition (2) of the present invention can emit fluorescence having a peak wavelength in the wavelength region of 590 to 605 nm by excitation with light in a wavelength region of 450 nm and at this time, can exhibit an external quantum efficiency of 60% or more. As a result of these capabilities, in the oxynitride phosphor powder of the present invention, long-wavelength orange fluorescence can be efficiently obtained by blue excitation light, and furthermore, white light having a high color rendering property can be efficiently obtained by the combination with blue light used as excitation light.

The fluorescence peak wavelength can be measured using a solid quantum efficiency measuring apparatus fabricated by combining an integrating sphere with FP-6500 manufactured by JASCO. The fluorescence spectrum correction can be performed using a secondary standard light source, but the fluorescence peak wavelength sometimes slightly varies depending on the measuring device used or correction conditions.

Also, after measuring the absorptivity and the internal quantum efficiency by a solid quantum efficiency measuring apparatus fabricated by combining an integrating sphere with FP-6500 manufactured by JASCO, the external quantum efficiency can be calculated from the product thereof.

The oxynitride phosphor powder of the present invention can be used in a light-emitting device for various lighting apparatuses by combining the powder with a known light-emitting source such as a light-emitting diode.

In particular, a light-emitting source capable of emitting excitation light having a peak wavelength of 330 to 500 nm is suitable for the oxynitride phosphor powder of the present invention. The oxynitride phosphor powder exhibits a high luminous efficiency in the ultraviolet region and enables fabrication of a light-emitting device having high performance. The luminous efficiency is high also in using a blue light source and a light-emitting device giving an excellent daytime white color or daylight color can be fabricated by the combination of yellow-orange fluorescence of the oxynitride phosphor powder of the present invention with blue excitation light.

The production method for the oxynitride phosphor powder of the present invention is specifically described below.

The oxynitride phosphor powder of the present invention is obtained by mixing and firing a silicon source substance, a europium source substance, a calcium source substance, and an aluminum source substance, to give a composition represented by the composition formula:

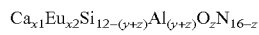

$$Ca_{x1}Eu_{x2}Si_{12-(y+z)}Al_{(y+z)}O_zN_{16-z}$$

wherein $0<x1\leq 2.50$, $0.01\leq x2\leq 0.20$, $0<y\leq 2.3$ and $1.5\leq z\leq 3.5$, or $0<x1\leq 2.70$, $0.05\leq x2\leq 0.20$, $2.3\leq y\leq 5.5$ and $1\leq z\leq 2.5$. The firing is preferably performed at a temperature of 1,500 to 2,000° C., more preferably from 1,700 to 1,800° C., in an inert gas atmosphere. Furthermore, the resulting fired product is preferably heat-treated at a temperature of 1,100 to 1,600° C., more preferably from 1,500 to 1,600° C., in an inert gas atmosphere.

The silicon source substance of the raw material is selected from nitride, oxynitride and oxide of silicon and a precursor substance capable of becoming an oxide of silicon by pyrolysis. Among others, crystalline silicon nitride is preferred, and by using crystalline silicon nitride, an oxynitride phosphor having a high external quantum efficiency can be obtained.

The europium source substance of the raw material is selected from nitride, oxynitride and oxide of europium and a precursor substance capable of becoming an oxide of europium by pyrolysis.

The calcium source substance of the raw material is selected from nitride, oxynitride and oxide of calcium and a precursor substance capable of becoming an oxide of calcium by pyrolysis.

The aluminum source substance of the raw material includes aluminum oxide, metal aluminum and aluminum nitride, and the powders thereof may be used individually or in combination.

In the firing, an Li-containing compound working as a sintering aid is preferably added for the purpose of accelerating the sintering and producing an α-SiAlON crystal phase at a lower temperature. The Li-containing compound used includes lithium oxide, lithium carbonate, metal lithium, and lithium nitride, and the powders thereof may be used individually or in combination. Also, the amount of the Li-containing compound added is appropriately from 0.01 to 0.5 mol in terms of Li element per mol of the fired oxynitride.

A silicon source substance, a europium source substance, a calcium source substance, and an aluminum source substance, is not particularly limited, and a well-known method, for example, a method of dry mixing the substances, and a method of wet mixing the substances in an inert solvent substantially incapable of reacting with each raw material component and then removing the solvent, may be employed. As the mixing apparatus, a V-shaped mixer, a rocking mixer, a ball mill, a vibration mill, a medium stirring mill, etc., are suitably used.

A mixture of the silicon source substance, the europium source substance, the calcium source substance, and the aluminum source substance, may be fired at a temperature of 1,500 to 2,000° C., preferably from 1,700 to 1,800° C., in an inert gas atmosphere, whereby a fired oxynitride represented by the composition formula above can be obtained. The inert gas atmosphere may be composed of an inert gas, for example, nitrogen or a rare gas such as argon, and a mixed gas thereof. In order to create an inert gas atmosphere, the atmosphere preferably contains no oxygen, but oxygen may be contained as an impurity in an amount of less than 0.1 vol %, furthermore, less than about 0.01 vol %. If the firing temperature is less than 1,500° C., the production of α-SiAlON requires heating for a long time and this is not practical. If the temperature exceeds 2,000° C., silicon nitride and α-SiAlON are sublimated and decomposed to produce free silicon and therefore, an oxynitride phosphor powder exhibiting high external quantum efficiency cannot be obtained. The heating furnace used for firing is not particularly limited as long as firing at 1,500 to 2,000° C. in an inert gas atmosphere can be performed. For example, a batch electric furnace of high frequency induction heating system or resistance heating system, a rotary kiln, a fluidized firing furnace, and a pusher-type electric furnace can be used. As for the crucible filled with the mixture, a BN-made crucible, a silicon nitride-made crucible, a graphite-made crucible, and a silicon carbide-made crucible can be used. The fired oxynitride obtained by firing is a powder with little aggregation and high dispersibility.

The fired oxynitride obtained by the above firing may be further heat-treated. By heat-treating the obtained fired oxynitride at a temperature of 1,100 to 1,600° C. in an inert gas atmosphere or a reducing gas atmosphere, an oxynitride phosphor powder exhibiting a high external quantum efficiency particularly at the time of emitting fluorescence having a peak wavelength in a wavelength region of, in composition (1), from 580 to 600 nm and in composition (2), from 590 to 605 nm by excitation with light having a wavelength of 450 nm can be obtained. The inert gas atmosphere may be the same as the inert gas atmosphere at the time of firing. The reducing gas atmosphere may be composed of a mixture of a reducing gas such as hydrogen, and an inert gas, for example, nitrogen or a rare gas such as argon. The atmosphere preferably contains no oxygen, but oxygen may be contained as an impurity in an amount of less than 0.1 vol %, furthermore, less than about 0.01 vol %. In order to obtain an oxynitride phosphor powder exhibiting higher external quantum efficiency, the heat treatment temperature is preferably from 1,500 to 1,600° C. If the heat treatment temperature is less than 1,100° C. or exceeds 1,600° C., the external quantum efficiency of the obtained oxynitride phosphor powder is reduced. The holding time at a maximum temperature in the case of performing a heat treatment is preferably 0.5 hours or more so as to obtain in particular high external quantum efficiency. Even when the heat treatment is performed for more than 4 hours, the external quantum efficiency is little enhanced for the extension of time or is scarcely changed. Therefore, the holding time at a maximum temperature in the case of performing a heat treatment is preferably from 0.5 to 4 hours.

The heating furnace used for the heat treatment is not particularly limited as long as a heat treatment at a temperature of 1,100 to 1,600° C. in an inert gas atmosphere or a reducing gas atmosphere can be performed. For example, a batch electric furnace of high frequency induction heating system or resistance heating system, a rotary kiln, a fluidized firing furnace, and a pusher-type electric furnace can be used. As for the crucible filled with the mixture, a BN-made crucible, a silicon nitride-made crucible, a graphite-made crucible, and a silicon carbide-made crucible can be used.

By performing a heat treatment at a temperature of 1,100 to 1,600° C. in an inert gas atmosphere or a reducing gas atmosphere, the fluorescence peak wavelength of the oxynitride phosphor powder of the present invention is shifted to the long wavelength side by approximately from 0.5 to 2.5 nm and at the same time, the external quantum efficiency and the luminous intensity at the fluorescence peak wavelength are enhanced, in comparison with the fired oxynitride before the heat treatment.

One preferred embodiment of the oxynitride phosphor powder of the present invention is a phosphor powder obtained by the above-described production method, more specifically, an oxynitride phosphor powder represented by the composition formula:

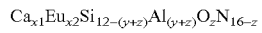

$Ca_{x1}Eu_{x2}Si_{12-(y+z)}Al_{(y+z)}O_zN_{16-z}$ wherein $0<x1 \leq 2.50$, $0.01 \leq x2 \leq 0.20$, $0<y \leq 2.3$ and $1.5 \leq z \leq 3.5$, or $0<x1 \leq 2.70$, $0.05 \leq x2 \leq 0.20$, $2.3 \leq y \leq 5.5$ and $1 \leq z \leq 2.5$, which is obtained by mixing a silicon source substance, a europium source substance, a calcium source substance, and an aluminum source substance, firing the mixture at a temperature of 1,500 to 2,000° C. in an inert gas atmosphere, and subsequently heat-treating the fired product at a temperature of 1,100 to 1,600° C. in an inert gas atmosphere.

EXAMPLES

The present invention is described in greater detail below by referring to specific examples.

Example 1

Silicon nitride, europium oxide, aluminum nitride, aluminum oxide and calcium carbonate were weighed to give the designed oxynitride composition of Table 1 in a glove box purged with nitrogen and mixed using a dry vibration mill to obtain a mixed powder. The specific surface area and average particle diameter of the silicon nitride powder were 0.3 m²/g and 8.0 μm, respectively. The obtained mixed powder was put in a silicon nitride-made crucible, and the crucible was charged into an electric furnace of graphite resistance heating system. The temperature was raised to 1,725° C. in the state of keeping the atmospheric pressure while flowing nitrogen into the electric furnace (oxygen concentration: less than 0.01 vol %) and then held at 1,725° C. for 12 hours to obtain a fired oxynitride.

The resulting fired oxynitride was dissociated and classified to obtain a powder having a particle diameter of 5 to 20 μm, and the obtained powder was put in an alumina crucible. The crucible was charged into an electric furnace of graphite resistance heating system, and the temperature was raised to 1,600° C. in the state of keeping the atmospheric pressure while flowing nitrogen into the electric furnace (oxygen concentration: less than 0.01 vol %) and then held at 1,600° C. for 1 hour to obtain the oxynitride phosphor powder of the present invention.

The average particle diameter ($D_{50}$) of the obtained oxynitride phosphor powder was 13.8 μm, and the specific surface area was 0.34 m²/g.

$D_{50}$ of the oxynitride phosphor powder of the present invention is a 50% diameter in the particle size distribution curve measured by a laser diffraction/scattering particle size distribution measuring apparatus. Also, the specific surface area of the oxynitride phosphor powder was measured using a specific surface area measuring apparatus, FlowSorb Model 2300, manufactured by Shimadzu Corporation according to the BET method by nitrogen gas adsorption.

Also, XRD analysis of the obtained oxynitride phosphor powder was performed. The oxynitride phosphor powder was composed of an α-SiAlON crystal phase and an aluminum nitride crystal phase, and their contents were 95 wt % and 5 wt %, respectively. The lattice constants of the α-SiAlON crystal phase and the aluminum nitride crystal phase were a=b=7.846 Å and c=5.703 Å, and a=b=3.071 Å and c=4.832 Å, respectively.

Furthermore, for evaluating the fluorescent properties of the obtained oxynitride phosphor powder, the fluorescence spectrum at an excitation wavelength of 450 nm was measured and at the same time, the absorptivity and internal quantum efficiency were measured, by using a solid quantum efficiency measuring apparatus fabricated by combining an integrating sphere with FP-6500 manufactured by JASCO. The fluorescence peak wavelength and the luminous intensity at that wavelength were derived from the obtained fluorescence spectrum, and the external quantum efficiency was calculated from the absorptivity and the internal quantum efficiency. Also, the relative fluorescence intensity indicative of luminance was defined as the relative value of luminous intensity at the fluorescence peak wavelength when the value of highest intensity of the emission spectrum by the same excitation wavelength of a commercially available YAG:Ce-based phosphor (P46Y3 produced by Kasei Optonix, Ltd.) is taken as 100%. The evaluation results of fluorescent properties of the oxynitride phosphor powder according to Example 1 are shown in Table 1, and the produced crystal phase, its content, lattice constant, specific surface area and average particle diameter of the oxynitride phosphor powder are shown in Table 2.

Examples 2 to 10

Figure 2:
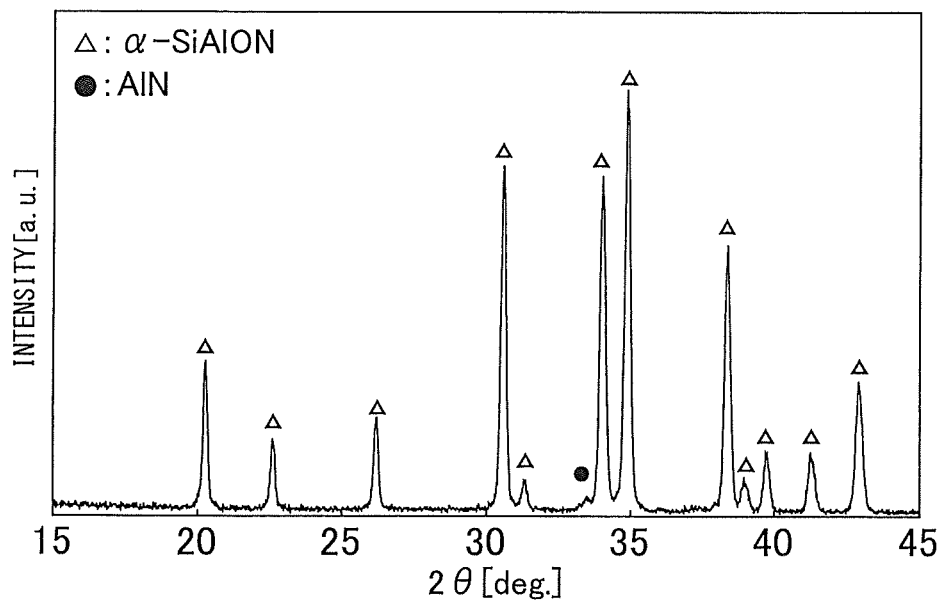
FIG. 2 shows the powder X-ray diffraction pattern of Example 2.
Figure 3:
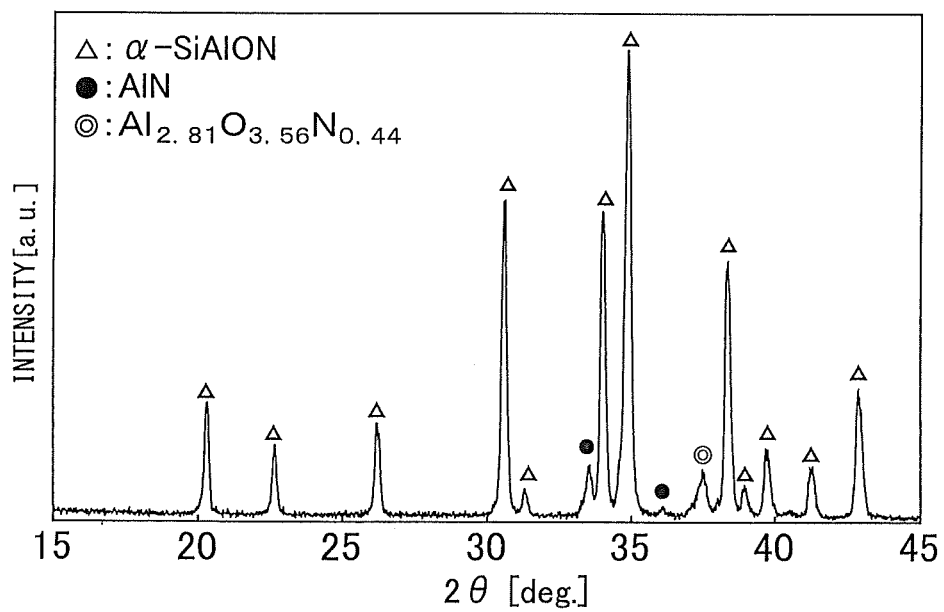
FIG. 3 shows the powder X-ray diffraction pattern of Example 4.

Oxynitride phosphor powders were obtained by the same method as in Example 1 except that raw material powders according to Examples 2 to 10 were weighed and mixed to give oxynitride phosphor powders having the designed compositions of Table 1. The fluorescent properties, average particle diameter, specific surface area, crystal phase produced, its content, and lattice content of each of the obtained oxynitride phosphor powders were measured by the same methods as in Example 1. The results are shown in Table 1 and Table 2. FIGS. 2 and 3 show the powder X-ray diffraction patterns of Examples 2 and 4. It is seen from FIG. 2 that the crystal phases produced were an α-SiAlON phase and an aluminum nitride phase. Also, it is seen from FIG. 3 that the crystal phases produced were an α-SiAlON phase, an aluminum nitride phase and an aluminum oxynitride phase ($Al_{2.81}O_{3.56}N_{0.44}$).

As understood from Table 1, among others, the oxynitride phosphor powders of Examples 3, 4, 8 and 9, where in the formula above, $0 < x1 \leq 2.50$, $0.01 \leq x2 \leq 0.20$, $0.5 < y \leq 2.0$ and $2.5 \leq z \leq 3.2$, exhibit a high external quantum efficiency.

Figure 4:
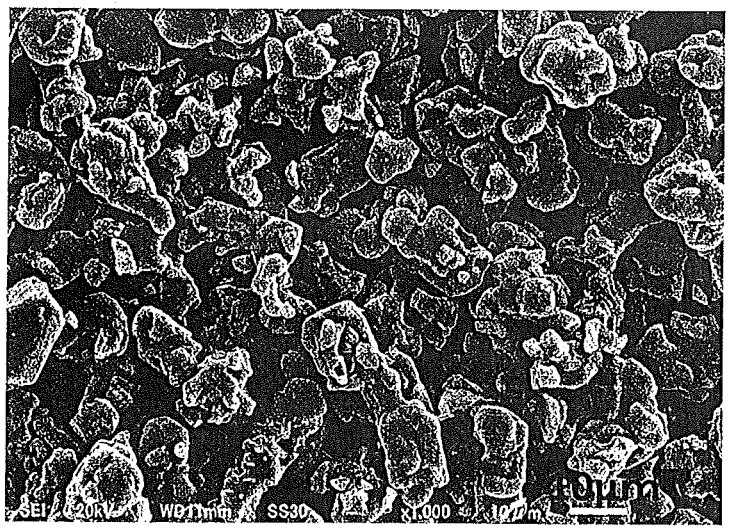
FIG. 4 is a scanning electron micrograph of Example 2.
Figure 5:
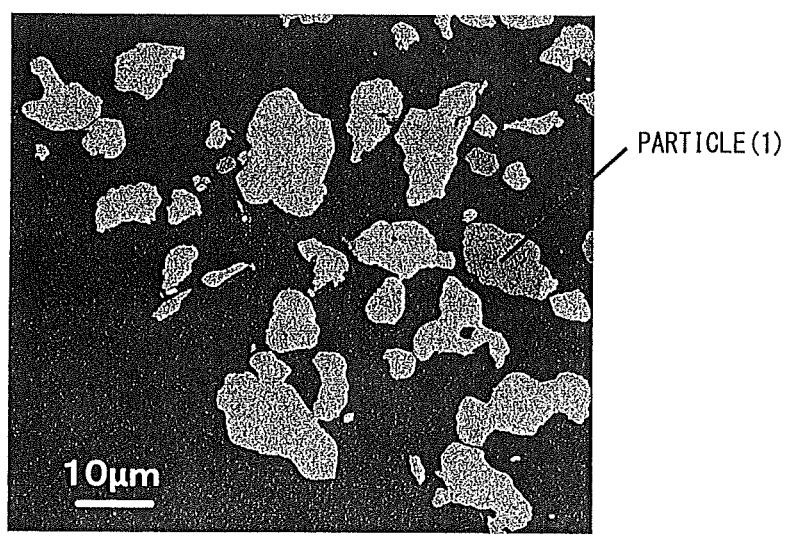
FIG. 5 is a cross-sectional scanning electron micrograph (reflected electron image) of Example 2.

FIG. 4 shows a scanning micrograph of the oxynitride phosphor powder of Example 2. It is seen that the particles have a relatively uniform particle diameter and the powder is composed of monodisperse particles without aggregation. Also, FIG. 5 shows a scanning micrograph (reflected electron image) of the cross-section of the oxynitride phosphor powder of Example 2. Particles looking relatively white and particles (particle (1)) looking black are present in the photograph, and the particle (1) is a particle containing aluminum nitride as the main component. The particle (1) was subjected to composition analysis by EDS, as a result, Si=0.2 at %, Al=29.8 at %, O=0.3 at %, N=28.8 at % and C=40.9 at %. Incidentally, C detected is due to the effect of the resin embedding the oxynitride phosphor powder.

Examples 11 and 12

Oxynitride phosphor powders were obtained by the same method as in Example 3 except that the specific surface area and average particle diameter of the silicon nitride powder as the raw material were changed to 2.5 m²/g and 1.5 μm and to 10.0 m²/g and 0.2 μm. The fluorescent properties, average particle diameter, specific surface area, crystal phase produced, its content, and lattice content of each of the obtained oxynitride phosphor powders were measured by the same methods as in Example 1. The results are shown in Table 1 and Table 2. It is seen that compared with Example 12 where the specific surface area and average particle diameter of the oxynitride phosphor powder were 0.99 m²/g and 9.7 μm, respectively, the external quantum efficiency was increased in Examples 3 and 11 where the specific surface area of the oxynitride phosphor powder was from 0.2 to 0.6 m²/g and the average particle diameter was from 10.0 to 20.0 μm.

Comparative Examples 1 to 13

Figure 6:
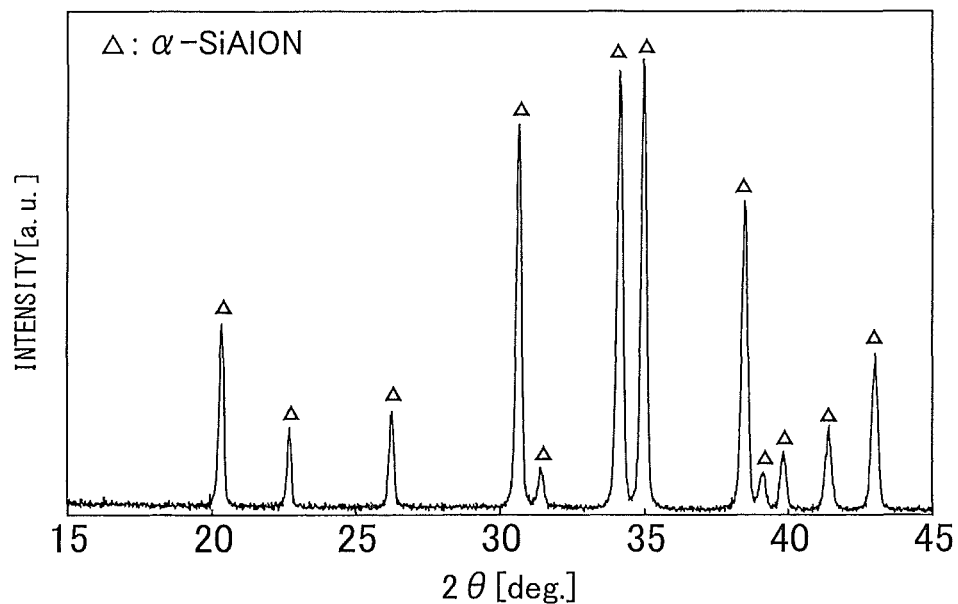
FIG. 6 shows the powder X-ray diffraction pattern of Comparative Example 5.

Oxynitride phosphor powders were obtained by the same method as in Example 1 except that raw material powders according to Comparative Examples 1 to 13 were weighed and mixed to give oxynitride phosphor powders having the designed compositions in Table 1. The fluorescent properties, average particle diameter, specific surface area, crystal phase produced, its content, and lattice content of each of the obtained oxynitride phosphor powders were measured by the same methods as in Example 1. The results are shown in Table 1 and Table 2. Also, FIG. 6 shows the powder X-ray diffraction pattern of Comparative Example 5. It is seen from FIG. 6 that the crystal phase produced was only an α-SiAlON phase. Although the powder X-ray diffraction pattern is not shown, in Comparative Example 4, an α-SiAlON phase and a β-SiAlON phase were produced.

TABLE 1

|  | x1 | x2 | y | z | Peak Wavelength [nm] | Relative Fluorescence Intensity [%] | Absorptivity [%] | External Quantum Efficiency [%] | Internal Quantum Efficiency [%] |
| --- | --- | --- | --- | --- | --- | --- | --- | --- | --- |
| Example 1 | 0.48 | 0.015 | 1.0 | 2 | 596 | 195 | 78.2 | 60.0 | 76.7 |
| Example 2 | 0.41 | 0.060 | 1.0 | 2 | 598 | 195 | 82.0 | 60.1 | 73.3 |
| Example 3 | 0.48 | 0.015 | 1.0 | 3.0 | 594 | 204 | 79.5 | 62.7 | 78.9 |
| Example 4 | 0.41 | 0.060 | 1.0 | 3.0 | 591 | 207 | 81.9 | 63.8 | 77.9 |
| Example 5 | 0.48 | 0.015 | 1.0 | 3.5 | 588 | 195 | 76.5 | 60.1 | 78.6 |
| Example 6 | 0.41 | 0.060 | 1.0 | 3.5 | 586 | 195 | 76.3 | 60.0 | 78.7 |
| Example 7 | 0.16 | 0.060 | 0.5 | 2.5 | 591 | 195 | 78.4 | 60.0 | 76.5 |
| Example 8 | 0.41 | 0.060 | 1.0 | 2.5 | 596 | 206 | 80.3 | 63.3 | 78.8 |
| Example 9 | 0.91 | 0.060 | 2.0 | 2.5 | 598 | 208 | 81.7 | 64.1 | 78.4 |
| Example 10 | 1.06 | 0.060 | 2.3 | 2.5 | 599 | 195 | 81.9 | 60.1 | 73.4 |
| Example 11 | 0.48 | 0.015 | 1.0 | 3 | 594 | 202 | 79.4 | 62.1 | 78.2 |
| Example 12 | 0.48 | 0.015 | 1.0 | 3 | 593 | 195 | 76.5 | 60.1 | 78.6 |
| Comparative Example 1 | 0.48 | 0.015 | 1.0 | 0.3 | 587 | 175 | 70.5 | 53.7 | 76.2 |
| Comparative Example 2 | 0.98 | 0.015 | 2.0 | 0.3 | 598 | 175 | 71.3 | 53.8 | 75.5 |
| Comparative Example 3 | 1.38 | 0.015 | 2.8 | 0.3 | 601 | 185 | 72.8 | 57.1 | 78.4 |
| Comparative Example 4 | 0.23 | 0.015 | 0.5 | 0.5 | 582 | 128 | 64.2 | 39.0 | 60.8 |
| Comparative Example 5 | 0.41 | 0.060 | 1.0 | 1.0 | 599 | 181 | 84.0 | 55.8 | 66.5 |
| Comparative Example 6 | 0.70 | 0.015 | 1.5 | 1.0 | 582 | 176 | 72.4 | 54.2 | 74.8 |
| Comparative Example 7 | 0.98 | 0.015 | 2.0 | 1.0 | 589 | 183 | 73.8 | 56.4 | 76.4 |
| Comparative Example 8 | 1.23 | 0.015 | 2.5 | 1.0 | 593 | 187 | 74.4 | 57.5 | 77.3 |
| Comparative Example 9 | 0.48 | 0.015 | 1.0 | 4.0 | 586 | 110 | 67.4 | 33.9 | 50.3 |
| Comparative Example 10 | 1.23 | 0.015 | 2.5 | 3.0 | 589 | 111 | 68.6 | 34.1 | 49.7 |
| Comparative Example 11 | 1.98 | 0.015 | 4.0 | 3.0 | 593 | 123 | 70.5 | 37.9 | 53.8 |
| Comparative Example 12 | 2.98 | 0.015 | 6.0 | 1.5 | 599 | 134 | 74.8 | 41.4 | 55.3 |
| Comparative Example 13 | 3.73 | 0.015 | 7.5 | 0.0 | 603 | 132 | 76.8 | 40.6 | 52.9 |

TABLE 2

| | Crystal Phase | Crystal Phase Content [wt %] | | | Lattice Constant of α-SiAlON | | Lattice Constant of AlN | | Specific Surface Area | Average Particle Diameter |
|---|---|---|---|---|---|---|---|---|---|---|
| | | α-SiAlON | AlN | AlON* | a [Å] | c [Å] | a [Å] | c [Å] | [m²/g] | [μm] |
| Example 1 | α-SiAlON + AlN | 95 | 5 | — | 7.846 | 5.703 | 3.071 | 4.832 | 0.34 | 13.8 |
| Example 2 | α-SiAlON + AlN | 95 | 5 | — | 7.848 | 5.708 | 3.069 | 4.830 | 0.36 | 13.1 |
| Example 3 | α-SiAlON + AlN + AlON | 81 | 10 | 9 | 7.872 | 5.727 | 3.092 | 4.811 | 0.26 | 16.8 |
| Example 4 | α-SiAlON + AlN + AlON | 77 | 12 | 11 | 7.871 | 5.725 | 3.095 | 4.811 | 0.27 | 15.7 |
| Example 5 | α-SiAlON + AlN + AlON | 73 | 13 | 14 | 7.892 | 5.740 | 3.095 | 4.812 | 0.37 | 12.8 |
| Example 6 | α-SiAlON + AlN + AlON | 72 | 13 | 15 | 7.891 | 5.739 | 3.093 | 4.811 | 0.38 | 12.5 |
| Example 7 | α-SiAlON + AlN + AlON | 87 | 5 | 8 | 7.840 | 5.702 | 3.063 | 4.820 | 0.22 | 19.9 |
| Example 8 | α-SiAlON + AlN | 92 | 8 | — | 7.860 | 5.713 | 3.074 | 4.838 | 0.27 | 16.2 |
| Example 9 | α-SiAlON + AlN | 90 | 10 | — | 7.887 | 5.736 | 3.084 | 4.854 | 0.28 | 16.6 |
| Example 10 | α-SiAlON + AlN | 90 | 10 | — | 7.887 | 5.736 | 3.084 | 4.854 | 0.31 | 15.8 |
| Example 11 | α-SiAlON + AlN + AlON | 75 | 12 | 13 | 7.873 | 5.728 | 3.094 | 4.812 | 0.53 | 10.6 |
| Example 12 | α-SiAlON + AlN + AlON | 72 | 13 | 15 | 7.874 | 5.728 | 3.095 | 4.811 | 0.99 | 9.7 |
| Comparative Example 1 | α-SiAlON | 100 | — | — | 7.806 | 5.677 | — | — | 0.39 | 11.2 |
| Comparative Example 2 | α-SiAlON | 100 | — | — | 7.827 | 5.693 | — | — | 0.37 | 11.8 |
| Comparative Example 3 | α-SiAlON | 100 | — | — | 7.876 | 5.728 | — | — | 0.33 | 13.2 |
| Comparative Example 4 | α-SiAlON + β-SiAlON | 72** | — | — | 7.772 | 5.646 | — | — | 0.31 | 13.8 |
| Comparative Example 5 | α-SiAlON | 100 | — | — | 7.817 | 5.685 | — | — | 0.36 | 11.6 |
| Comparative Example 6 | α-SiAlON | 100 | — | — | 7.818 | 5.686 | — | — | 0.31 | 14.1 |
| Comparative Example 7 | α-SiAlON | 100 | — | — | 7.839 | 5.699 | — | — | 0.29 | 15.1 |
| Comparative Example 8 | α-SiAlON | 100 | — | — | 7.845 | 5.706 | — | — | 0.31 | 14.1 |
| Comparative Example 9 | α-SiAlON + AlN + AlON | 67 | 15 | 18 | 7.896 | 5.743 | 3.101 | 4.796 | 0.37 | 12.8 |
| Comparative Example 10 | α-SiAlON + AlN | 85 | 15 | — | 7.892 | 5.741 | 3.089 | 4.853 | 0.28 | 16.6 |
| Comparative Example 11 | α-SiAlON + AlN | 68 | 32 | — | 7.971 | 5.801 | 3.122 | 4.997 | 0.32 | 13.7 |
| Comparative Example 12 | α-SiAlON + AlN | 65 | 35 | — | 7.992 | 5.806 | 3.126 | 4.997 | 0.27 | 16.2 |
| Comparative Example 13 | α-SiAlON + AlN | 57 | 43 | — | 7.999 | 5.809 | 3.129 | 4.994 | 0.27 | 16.2 |

*Aluminum oxynitride crystal phase ($Al_{2.81}O_{3.56}N_{0.44}$)
**Containing 28 wt % of β-SiAlON crystal phase Example 21

Silicon nitride, europium oxide, aluminum nitride, aluminum oxide and calcium carbonate were weighed to give the designed oxynitride composition in Table 3 in a glove box purged with nitrogen and mixed using a dry vibration mill to obtain a mixed powder. The specific surface area and average particle diameter of the silicon nitride powder were 0.3 m²/g and 8.0 μm, respectively. The obtained mixed powder was put in a silicon nitride-made crucible, and the crucible was charged into an electric furnace of graphite resistance heating system. The temperature was raised to 1,725° C. in the state of maintaining the atmospheric pressure while flowing nitrogen into the electric furnace and then held at 1,725° C. for 12 hours to obtain a fired oxynitride.

The resulting fired oxynitride was dissociated and classified to obtain a powder having a particle diameter of 5 to 20 μm, and the obtained powder was put in an alumina crucible. The crucible was charged into an electric furnace of graphite resistance heating system, and the temperature was raised to 1,600° C. in the state of maintaining the atmospheric pressure while flowing nitrogen into the electric furnace and then held at 1,600° C. for 1 hour to obtain the oxynitride phosphor powder of the present invention.

$D_{50}$ of the oxynitride phosphor powder of the present invention is a 50% diameter in the particle size distribution curve measured by a laser diffraction/scattering particle size distribution measuring apparatus. Also, the specific surface area of the oxynitride phosphor powder was measured using a specific surface area measuring apparatus, FlowSorb Model 2300, manufactured by Shimadzu Corporation according to the BET method by nitrogen gas adsorption.

Also, XRD analysis of the obtained oxynitride phosphor powder was performed. The oxynitride phosphor powder was composed of an α-SiAlON crystal phase and an aluminum nitride crystal phase, and their contents were 97 wt % and 3 wt %, respectively. The lattice constants of the α-SiAlON crystal phase and the aluminum nitride crystal phase were a=b=7.941 Å and c=5.776 Å, and a=b=3.105 Å and c=4.886 Å, respectively.

Furthermore, for evaluating the fluorescent properties of the obtained oxynitride phosphor powder, the fluorescence spectrum at an excitation wavelength of 450 nm was measured and at the same time, the absorptivity and internal quantum efficiency were measured, by using a solid quantum efficiency measuring apparatus fabricated by combining an integrating sphere with FP-6500 manufactured by JASCO. The fluorescence peak wavelength and the luminous intensity at that wavelength were derived from the obtained fluorescence spectrum, and the external quantum efficiency was calculated from the absorptivity and the internal quantum efficiency. Also, the relative fluorescence intensity indicative of luminance was defined as the relative value of luminous intensity at the fluorescence peak wavelength when the value of highest intensity of the emission spectrum by the same excitation wavelength of a commercially available YAG:Ce-based phosphor (P46Y3 produced by Kasei Optonix, Ltd.) is taken as 100%. The evaluation results of fluorescent properties of the oxynitride phosphor powder according to Example 21 are shown in Table 3, and the produced crystal phase, its content, lattice constant, specific surface area and average particle diameter of the oxynitride phosphor powder are shown in Table 4.

Examples 22 to 29

Figure 7:
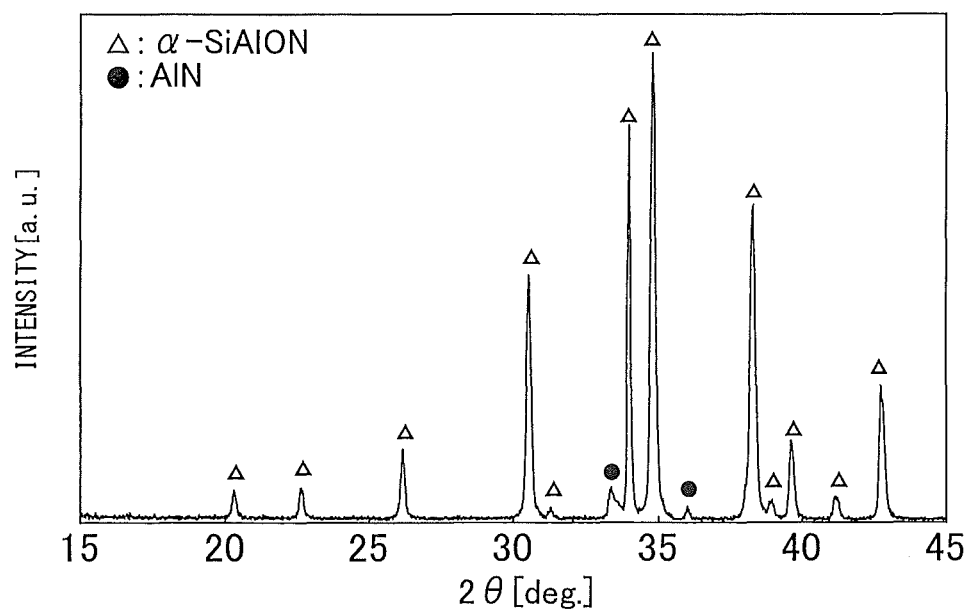
FIG. 7 shows the powder X-ray diffraction pattern of Example 22.
Figure 8:
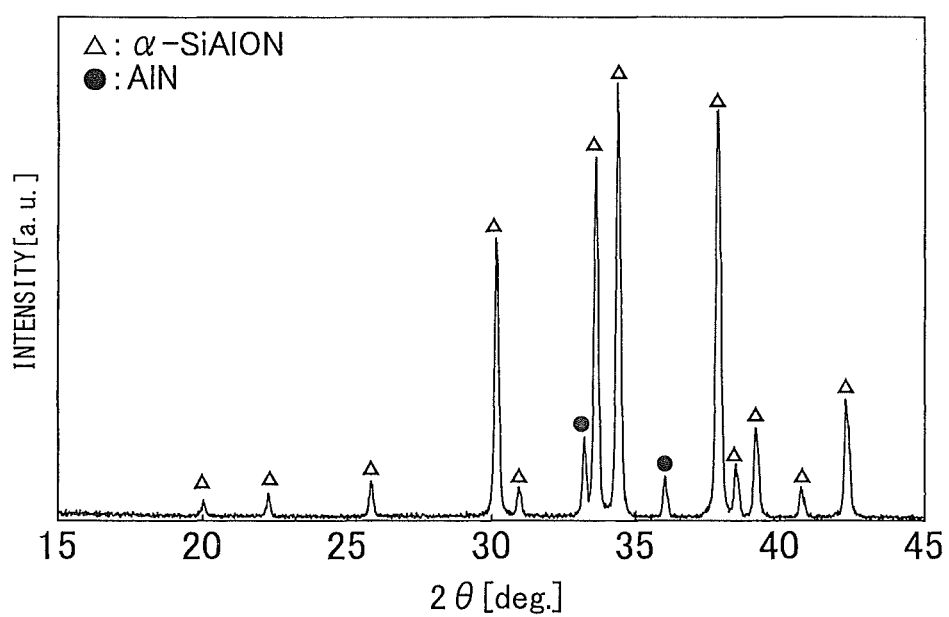
FIG. 8 shows the powder X-ray diffraction pattern of Example 29.

Oxynitride phosphor powders were obtained by the same method as in Example 21 except that raw material powders according to Examples 22 to 29 were weighed and mixed to give oxynitride phosphors powder having the designed compositions in Table 3. The fluorescent properties, average particle diameter, specific surface area, crystal phase produced, its content, and lattice content of each of the obtained oxynitride phosphor powders were measured by the same methods as in Example 21. The results are shown in Table 3 and Table 4. FIGS. 7 and 8 show the powder X-ray diffraction patterns of Examples 22 and 29. As can be seen from FIGS. 7 and 8, the crystal phases produced were an α-SiAlON phase and an aluminum nitride phase.

Examples 30 and 31

Oxynitride phosphor powders were obtained by the same method as in Example 25 except that the specific surface area and average particle diameter of the silicon nitride powder of the raw material were changed to 2.5 m²/g and 1.5 μm and to 10.0 m²/g and 0.2 μm. The fluorescent properties, average particle diameter, specific surface area, crystal phase produced, its content, and lattice content of each of the obtained oxynitride phosphor powders were measured by the same methods as in Example 21. The results are shown in Table 3 and Table 4. Compared with Example 31 where the specific surface area and average particle diameter of the oxynitride phosphor powder were 1.13 m²/g and 9.2 μm, respectively, the external quantum efficiency was increased in Examples 25 and 30 where the specific surface area of the oxynitride phosphor powders was from 0.2 to 0.6 m²/g and the average particle diameter thereof was from 10.0 to 20.0 μm.

INDUSTRIAL APPLICABILITY

The oxynitride phosphor powder of the present invention is a highly efficient oxynitride phosphor powder that emits fluorescence having a peak wavelength in a broad wavelength region of 580 to 605 nm and exhibits a particularly high external quantum efficiency in the light emission, and can be utilized as a phosphor having high luminance enough for practical use so as to adjust the color temperature of a white LED or obtain yellow-orange luminescence of a desired wavelength.

The invention claimed is:

1. An oxynitride phosphor powder containing an α-SiAlON crystal phase and an aluminum nitride crystal phase; represented by composition formula:

$$Ca_{x1}Eu_{x2}Si_{12-(y+z)}Al_{(y+z)}O_zN_{16-z}$$

wherein x1, x2, y and z are $0<x1\leq2.50$, $0.01\leq x2\leq0.20$, $0<y\leq2.3$ and $2.5\leq z\leq3.5$ or x1, x2, y and z are $0<x1\leq2.70$, $0.05\leq x2\leq0.20$, $4.0\leq y\leq5.5$ and $1\leq z\leq2.5$.

2. The oxynitride phosphor powder according to claim 1, wherein x1, x2, y and z are $0<x1\leq2.50$, $0.01\leq x2\leq0.20$, $0.5<y\leq2.0$ and $2.5\leq z\leq3.2$.

3. The oxynitride phosphor powder according to claim 1, wherein the content of aluminum nitride crystal phase is from more than 0 wt % to less than 15 wt %.

TABLE 3

| | x1 | x2 | y | z | Peak Wavelength [nm] | Relative Fluorescence Intensity [%] | Absorptivity [%] | External Quantum Efficiency [%] | Internal Quantum Efficiency [%] |
|---|---|---|---|---|---|---|---|---|---|
| Example 21 | 1.85 | 0.100 | 4.0 | 1.0 | 598 | 200 | 77.0 | 61.4 | 79.8 |
| Example 22 | 1.70 | 0.200 | 4.0 | 1.0 | 600 | 199 | 79.8 | 61.4 | 76.9 |
| Example 23 | 1.85 | 0.100 | 4.0 | 2.0 | 596 | 197 | 76.9 | 61.0 | 79.3 |
| Example 24 | 1.70 | 0.200 | 4.0 | 2.0 | 594 | 195 | 80.3 | 60.9 | 75.9 |
| Example 25 | 1.85 | 0.100 | 4.0 | 2.5 | 593 | 199 | 77.1 | 61.1 | 79.2 |
| Example 26 | 1.70 | 0.200 | 4.0 | 2.5 | 595 | 197 | 78.0 | 60.8 | 78.0 |
| Example 27 | 1.00 | 0.100 | 2.3 | 1.8 | 601 | 196 | 78.8 | 60.4 | 76.6 |
| Example 28 | 1.85 | 0.100 | 4.0 | 1.8 | 603 | 197 | 80.6 | 60.9 | 75.5 |
| Example 29 | 2.60 | 0.100 | 5.5 | 1.8 | 602 | 196 | 81.7 | 60.3 | 73.8 |
| Example 30 | 1.85 | 0.100 | 4.0 | 2.5 | 593 | 197 | 76.5 | 60.7 | 79.3 |
| Example 31 | 1.85 | 0.100 | 4.0 | 2.5 | 593 | 196 | 76.5 | 60.2 | 78.7 |

TABLE 4

| | Crystal Phase | Crystal Phase Content [wt %] | | | Lattice Constant of α-SiAlON | | Lattice Constant of AlN | | Specific Surface Area | Average Particle Diameter |
|---|---|---|---|---|---|---|---|---|---|---|
| | | α-SiAlON | AlN | AlON | a [Å] | c [Å] | a [Å] | c [Å] | [m²/g] | [μm] |
| Example 21 | α-SiAlON + AlN | 97 | 3 | — | 7.941 | 5.776 | 3.105 | 4.886 | 0.31 | 14.1 |
| Example 22 | α-SiAlON + AlN | 97 | 3 | — | 7.943 | 5.777 | 3.106 | 4.888 | 0.33 | 13.2 |
| Example 23 | α-SiAlON + AlN | 95 | 5 | — | 7.946 | 5.779 | 3.107 | 4.835 | 0.41 | 11.7 |
| Example 24 | α-SiAlON + AlN | 94 | 6 | — | 7.948 | 5.781 | 3.108 | 4.832 | 0.39 | 11.2 |
| Example 25 | α-SiAlON + AlN | 89 | 11 | — | 7.954 | 5.785 | 3.110 | 4.836 | 0.32 | 13.7 |
| Example 26 | α-SiAlON + AlN | 87 | 13 | — | 7.953 | 5.784 | 3.110 | 4.838 | 0.34 | 12.8 |
| Example 27 | α-SiAlON + AlN | 98 | 2 | — | 7.881 | 5.732 | 3.081 | 4.848 | 0.36 | 12.1 |
| Example 28 | α-SiAlON + AlN | 94 | 6 | — | 7.945 | 5.779 | 3.107 | 4.890 | 0.35 | 12.5 |
| Example 29 | α-SiAlON + AlN | 73 | 27 | — | 7.972 | 5.798 | 3.117 | 4.907 | 0.28 | 15.6 |
| Example 30 | α-SiAlON + AlN | 92 | 8 | — | 7.954 | 5.785 | 3.110 | 4.838 | 0.52 | 10.9 |
| Example 31 | α-SiAlON + AlN | 93 | 7 | — | 7.954 | 5.785 | 3.110 | 4.835 | 1.13 | 9.2 |

*Aluminum oxynitride crystal phase ($Al_{2.81}O_{3.56}N_{0.44}$)
**Containing 28 wt % of β-SiAlON crystal phase 4. The oxynitride phosphor powder according to claim 1, wherein lattice constants of the α-SiAlON crystal phase constituting the oxynitride phosphor powder are 7.84 Å≤a=b≤7.89 Å and 5.70 Å≤c≤5.74 Å.

5. The oxynitride phosphor powder according to claim 1, wherein fluorescence having a peak wavelength in a wavelength region of 580 to 600 nm is emitted by excitation with light having a wavelength of 450 nm and the external quantum efficiency in the light emission is 60% or more.

6. The oxynitride phosphor powder according to claim 1, wherein in said composition formula, 2.3<y≤2.5 and the content of aluminum nitride crystal phase is from more than 0 wt % to less than 15 wt %.

7. The oxynitride phosphor powder according to claim 1, wherein in said composition formula, 2.5<y≤5.5 and the content of aluminum nitride crystal phase is from more than 0 wt % to less than 32 wt %.

8. The oxynitride phosphor powder according to claim 1, wherein lattice constants of the α-SiAlON crystal phase constituting the oxynitride phosphor powder are, in said composition formula, 2.3<y≤4.0, 7.90 Å≤a=b≤7.96 Å and 5.75 Å≤c≤5.79 Å.

9. The oxynitride phosphor powder according to claim 1, wherein lattice constants of the α-SiAlON crystal phase constituting the oxynitride phosphor powder are, in said composition formula, 4.0<y≤5.5, 7.95 Å≤a=b≤7.99 Å and 5.77 Å≤c≤5.80 Å.

10. The oxynitride phosphor powder according to claim 1, wherein fluorescence having a peak wavelength in a wavelength region of 590 to 605 nm is emitted by excitation with light having a wavelength of 450 nm and external quantum efficiency in the light emission is 60% or more.

11. The oxynitride phosphor powder according to claim 1, wherein 50% diameter ($D_{50}$) in a particle size distribution curve measured by a laser diffraction/scattering particle size distribution measuring apparatus is 10.0 to 20.0 μm and the specific surface area is 0.2 to 0.6 m²/g.

12. A method of producing an oxynitride phosphor powder comprising mixing a silicon source substance, an aluminum source substance, a calcium source substance, and a europium source substance to give a composition represented by composition formula:

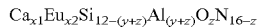

$Ca_{x1}Eu_{x2}Si_{12-(y+z)}Al_{(y+z)}O_zN_{16-z}$ wherein x1, x2, y and z are 0<x1≤2.50, 0.01≤x2≤0.20, 0<y≤2.3 and 2.5≤z≤3.5, or x1, x2, y and z are 0<x1≤2.70, 0.05≤x2≤0.20, 4.0≤y≤5.5 and 1≤z≤2.5, and firing the mixture to produce an oxynitride phosphor powder containing an α-SiAlON crystal phase and an aluminum nitride crystal phase.

13. The method according to claim 12, wherein said firing is performed at a temperature of 1,500 to 2,000° C. in an inert gas atmosphere.

14. The method according to claim 12, wherein a fired product obtained by said firing is further heat-treated at a temperature of 1,100 to 1,600° C. in an inert gas atmosphere.

15. The method according to claim 13, wherein a fired product obtained by said firing is further heat-treated at a temperature of 1,100 to 1,600° C. in an inert gas atmosphere.

16. The oxynitride phosphor powder according to claim 6, wherein lattice constants of the α-SiAlON crystal phase constituting the oxynitride phosphor powder are, in said composition formula, 2.3<y≤4.0, 7.90 Å≤a=b≤7.96 Å and 5.75 Å≤c≤5.79 Å.

17. The oxynitride phosphor powder according to claim 7, wherein lattice constants of the α-SiAlON crystal phase constituting the oxynitride phosphor powder are, in said composition formula, 2.3<y≤4.0, 7.90 Å≤a=b≤7.96 Å and 5.75 Å≤c≤5.79 Å.

18. The oxynitride phosphor powder according to claim 6, wherein lattice constants of the α-SiAlON crystal phase constituting the oxynitride phosphor powder are, in said composition formula, 4.0<y≤5.5, 7.95 Å≤a=b≤7.99 Å and 5.77 Å≤c≤5.80 Å.

19. The oxynitride phosphor powder according to claim 7, wherein lattice constants of the α-SiAlON crystal phase constituting the oxynitride phosphor powder are, in said composition formula, 4.0<y≤5.5, 7.95 Å≤a=b≤7.99 Å and 5.77 Å≤c≤5.80 Å.

20. The oxynitride phosphor powder according to claim 1, wherein said oxynitride phosphor powder emits fluorescence having a peak wavelength in a wavelength region of 580 to 605 nm by excitation with light having a wavelength of 450 nm and exhibits an external quantum efficiency in a light emission of 60% or more.

21. The oxynitride phosphor powder according to claim 1, produced by the method of claim 12.

22. The oxynitride phosphor powder according to claim 3, wherein content of the aluminum nitride crystal phase is 5 wt % to less than 12 wt %.

23. The oxynitride phosphor powder according to claim 6, wherein content of the aluminum nitride crystal phase is 1 wt % to less than 15 wt %.

24. The oxynitride phosphor powder according to claim 7, wherein content of the aluminum nitride crystal phase is 3 wt % to less than 32 wt %.

* * * * *